United States Patent
Fukuhisa et al.

(10) Patent No.: US 6,631,148 B1
(45) Date of Patent: Oct. 7, 2003

(54) SEMICONDUCTOR LASER AND A MANUFACTURING METHOD FOR THE SAME

(75) Inventors: Toshiya Fukuhisa, Matsubara (JP); Akio Yoshikawa, Kyotanabe (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/515,248

(22) Filed: Feb. 29, 2000

(30) Foreign Application Priority Data

Mar. 3, 1999 (JP) .......................................... 11-055020

(51) Int. Cl.[7] ................................................. H01S 5/00
(52) U.S. Cl. ............................... 372/43; 342/46; 342/45
(58) Field of Search .............................. 372/46, 48, 45, 372/44; 11/43

(56) References Cited

U.S. PATENT DOCUMENTS

| | | | |
|---|---|---|---|
| 5,146,467 A | * 9/1992 | Kadowaki et al. | ............ 372/44 |
| 5,161,167 A | * 11/1992 | Murakami et al. | ............ 372/45 |
| 5,586,136 A | * 12/1996 | Honda et al. | .................. 372/45 |
| 5,757,835 A | 5/1998 | Ono et al. | |
| 5,949,809 A | * 9/1999 | Ashida | ........................ 372/46 |
| 6,023,484 A | * 2/2000 | Matsumoto et al. | .......... 372/45 |

FOREIGN PATENT DOCUMENTS

| | | |
|---|---|---|
| EP | 0384756 A2 | 2/1990 |
| JP | 427184 | 1/1992 |
| JP | 11-204877 | 7/1999 |

* cited by examiner

Primary Examiner—Paul Ip
Assistant Examiner—Hung Vy

(57) ABSTRACT

A semiconductor laser, includes: a first cladding layer; an active layer that is formed on top of the first cladding layer; a second cladding layer that is formed on top of the active layer and has a different type of conductivity to the first cladding layer; an etch-stop layer that is formed on top of the second cladding layer and has a same type of conductivity as the second cladding layer; and a light-confining construction that is formed on top of the etch-stop layer by an etching process. The etch-stop layer has a surface part that contacts the light-confining construction. This surface part is composed of an $(Al_xGa_{1-x})_yIn_{1-y}P$ semiconductor, where $0.2 \leq x < 0.7$ and $0 < y \leq 1$.

11 Claims, 6 Drawing Sheets

FIG. 2C  THERMAL CLEANING

SEMICONDUCTOR LASER AND A MANUFACTURING METHOD FOR THE SAME

BACKGROUND OF THE INVENTION

1. Field of the Invention

The present invention relates to a semiconductor laser used as a light source in an optical disc device and to a manufacturing method for such semiconductor laser.

2. Description of the Prior Art

Optical disc drives for digital video discs (DVDs) and other such media have been developed in recent years. Of the semiconductor lasers currently available, such devices mainly use AlGaInP-type semiconductor lasers that emit laser light of a short wavelength as their light sources.

FIG. 7 shows a cross-section of a real index guided-type laser. The expressions "above" and "below" in the following explanation refer to the structure when FIG. 7 is in an upright position. The illustrated real index guided-type laser has an n-type GaAs substrate 1, on which an n-type GaAs buffer layer 2, an n-type cladding layer 3 made of $Al_{0.35}Ga_{0.15}In_{0.5}P$, an active layer 4, a first p-type cladding layer 5 made of $Al_{0.35}Ga_{0.15}In_{0.5}P$, and an etch-stop layer 6 made of $(Al_xGa_{1-x})_{0.5}In_{0.5}P$ (where $0 \leq x \leq 0.1$), $Al_zGa_{1-z}As$ (where $0.4 \leq z \leq 1$) or the like are successively formed in the stated order. A second p-type cladding layer 7 is then formed from $Al_{0.35}Ga_{0.15}In_{0.5}P$ as a ridge in the center of the upper surface of the etch-stop layer 6. An ohmic contact layer 8 made of p-type $Ga_{0.5}In_{0.5}P$ is then formed on top of this second p-type cladding layer 7. A current-blocking layer 9 made of n-type $Al_{0.35}Ga_{0.15}In_{0.5}P$ is formed on both sides of the second p-type cladding layer 7 and the ohmic contact layer 8, and a cap layer 10 made of p-type GaAs is then formed on top of the ohmic contact layer 8 and the current-blocking layer 9. A p-type electrode 11 is formed on the cap layer 10, and an n-type electrode 12 is formed on the back of the n-type GaAs substrate 1. The second p-type cladding layer 7 and the current-blocking layer 9 form a light-confining construction, with light being confined within this and the n-type cladding layer 3. Note that the materials cited here are mere examples, so that other combinations of materials may be used.

Each layer in the AlGaInP-type semiconductor laser described above is successively formed using metalorganic vapor phase epitaxy (MOVPE). The light-confining construction is formed as follows. A material layer used to produce the second p-type cladding layer 7 is first provided on top of the etch-stop layer 6, an etching mask is applied to the part of the material layer that corresponds to the second p-type cladding layer 7, and an etching solution including sulfuric acid is applied to the unmasked parts of the material layer. This results in the unmasked parts being etched as far as the etch-stop layer 6, leaving a ridge of the material layer that forms the second p-type cladding layer 7. The etching mask is then removed, and the current-blocking layer 9 made of $Al_{0.35}Ga_{0.15}In_{0.5}P$ is formed through crystal growth using MOVPE. Before this current-blocking layer 9 is formed, however, impurities (which are mainly composed of the etching solution that remains after the etching process) need to be removed from the surface of the multilayer structure formed of the n-type GaAs substrate 1 to the ohmic contact layer 8. These impurities are removed by a thermal cleaning process where the multilayer structure is heated to a high temperature (generally 700° C. or higher) that is near the crystal growth temperature of the current-blocking layer 9 that is formed next. To prevent phosphorous from being vaporized from the surface of the ohmic contact layer 8, a gas such as phosphine ($PH_3$) is supplied during the heating.

An AlGaInP semiconductor laser used in an optical disc device needs to have improved laser characteristics in keeping with the optical disc device, which is to say, to oscillate in a unified lateral mode and to have a low threshold current. As a result, the thickness and shape of the first p-type cladding layer 5 and second p-type cladding layer 7 need to be appropriately determined, while the crystallization of the current-blocking layer 9 needs to be improved.

SUMMARY OF THE INVENTION

It is a first object of the present invention to provide a semiconductor laser that has improved laser characteristics, such as a lower threshold current.

It is a second object of the present invention to provide a manufacturing method for a semiconductor laser that has improved laser characteristics, such as a lower threshold current.

In order to achieve the stated objects, the inventors first examined the following aspects of conventional semiconductor lasers.

Firstly, the inventors studied why irregularities (bumps and concaves) appear in the surface of the etch-stop layer. When the etch-stop layer is formed of $(Al_xGa_{1-x})_{0.5}In_{0.5}P$ (where $0 \leq x \leq 0.1$), $Al_zGa_{1-z}As$ (where $0.4 \leq z \leq 1$) or the like, crystal growth has to be performed at a temperature of 700° C. or higher to obtain a second p-type cladding layer and a current blocking layer with a high degree of crystallization. Thermal cleaning also has to be performed at a temperature of 700° C. or higher. Due to these high temperatures, the $(Al_xGa_{1-x})_{0.5}In_{0.5}P$ (where $0 \leq x \leq 0.1$) or $Al_zGa_{1-z}As$ (where $0.4 \leq z \leq 1$) sublimates at the surface of the etch-stop layer. In other words, the heating performed when the second p-type cladding layer is formed using MOVPE causes sublimation which results in irregularities being formed in the surface of this layer. The heating performed when the current blocking layer is formed using MOVPE and the heating performed as part of the thermal cleaning also cause sublimation in the surface of the etch-stop layer, which also causes irregularities. The part of the structure forming the current blocking layer is subjected to high temperature at least twice during the manufacturing process, so that the irregularities in its surface are more prominent than those in the surface of the second p-type cladding layer. As a result, the second p-type cladding layer and the current blocking layer cannot be formed with a high degree of crystallization, which makes it impossible to produce a semiconductor laser with the desired characteristics. Through experimentation, the inventors found that the sizes of the irregularities in the surface of the etch-stop layer depend on the proportion of aluminum to gallium in the $(Al_xGa_{1-x})_yIn_{1-y}P$ material forming the etch-stop layer.

A second phenomenon is the formation of a metamorphosed layer on the surface of the etch-stop layer. When the etch-stop layer is formed of $(Al_xGa_{1-x})_{0.5}In_{0.5}P$ (where $0 \leq x \leq 0.1$) or $Al_zGa_{1-z}As$ (where $0.4 \leq z \leq 1$) and thermal cleaning is performed in the presence of a gas such as phosphine ($PH_3$) at a temperature of 700° C. or higher, the $(Al_xGa_{1-x})_{0.5}In_{0.5}P$ (where $0 \leq x \leq 0.1$) or $Al_zGa_{1-z}As$ (where $0.4 < z < 1$) surface of the etch-stop layer reacts with the phosphine or other gas, forming a metamorphosed layer. Also, crystal growth has to be performed at a temperature of 700° C. or higher to obtain a second p-type cladding layer and a current blocking layer with a high degree of crystallization. When such high temperature is used, however, the surface of the etch-stop layer will absorb more of the impurities such as silicon that remain inside the reactor (while the reaction takes place after first evacuating the reactor, it is practically impossible to remove all such impurities) than are absorbed when a lower temperature is used. These absorbed impurities are one cause in the formation of a region (metamorphosed layer) of crystal defects. The part of the structure forming the current blocking layer is subjected to high temperatures at least twice, during which the part comes into contact with the impurities and phosphine gas, making the formation of a metamorphosed layer more evident for the surface of the etch-stop layer than for the surface of the second p-type cladding layer. In other words, when the second p-type cladding layer and current blocking layer are formed on top of an etch stop layer that has a metamorphosed layer formed on its surface, a high degree of crystallization cannot be achieved and a semiconductor laser with the desired characteristics cannot be produced. From experimentation, the inventors found that the extent to which a metamorphosed layer is formed on the surface of the etch-stop layer depends on the proportion of aluminum to gallium in the $(Al_xGa_{1-x})_yIn_{1-y}P$ material forming the etch-stop layer.

The stated first object of the present invention can be achieved by a semiconductor laser, including: a first cladding layer; an active layer that is formed on top of the first cladding layer; a second cladding layer that is formed on top of the active layer and has a different type of conductivity to the first cladding layer; an etch-stop layer that is formed on top of the second cladding layer and has a same type of conductivity as the second cladding layer; and a light-confining construction that is formed on top of the etch-stop layer by an etching process, wherein the etch-stop layer has a surface part that contacts the light-confining construction, the surface part being composed of an $(Al_xGa_{1-x})_yIn_{1-y}P$ semiconductor, where $0.2 \leq x < 0.7$ and $0 < y \leq 1$.

In a semiconductor laser of this construction, the etch-stop layer has a surface part formed of an $(Al_xGa_{1-x})_yIn_{1-y}P$ semiconductor (where $0.2 \leq x < 0.7$ and $0 < y \leq 1$) that suffers from relatively little sublimation and is relatively reactive with various gases. As a result, sublimation of the surface of the etch-stop layer is suppressed when the layer is exposed to high temperatures as part of the thermal cleaning process and the process forming the layers composing the light-confining structure adjacent to the etch stop layer. The surface of the layer also does not react with the surrounding gas.atmosphere during these processes. For these two reasons, an extremely flat etch stop layer can be achieved, with no metamorphosed layer being formed on its surface. This makes it possible to form the layers composing the light-confining structure on top of the etch stop layer with no decrease in the degree of crystallization, and to produce a semiconductor laser with superior laser characteristics (threshold current, slope efficiency).

Here, the light-confining construction may include: a third cladding layer that is formed as a ridge on a specified region of a surface of the etch-stop layer and has a same type of conductivity as the etch-stop layer; and a current-blocking layer that has a different type of conductivity to the third cladding layer and is formed on both sides of the third cladding layer on regions of the surface of the etch-stop layer aside from the specified region.

Here, the etch-stop layer may have a band gap that is narrower than a band gap of the active layer.

In addition to the effects described above, light that is emitted by the active layer will be absorbed by the etch stop layer, so that it becomes unnecessary to provide a separate layer for absorbing this light. As a result, a self-excited oscillating laser (a pulse laser) can be achieved with a smaller overall structure.

The second object of the present invention can be achieved by a semiconductor laser manufacturing method, including: a first process forming (i) a first cladding layer, (ii) an active layer on top of the first cladding layer, and (iii) a second cladding layer on top of the active layer, the second cladding layer having a different type of conductivity to the first cladding layer; a second process for forming an etch-stop layer on top of the second cladding layer, the etch-stop layer having a same type of conductivity as the second cladding layer; a third process for forming a ridge-shaped third cladding layer on a specified region of a surface of the etch-stop layer using liquid-phase etching, the third cladding layer having a same type of conductivity as the etch-stop layer; a fourth process for performing thermal cleaning in a specified gas atmosphere after the third process has finished; a fifth process for forming a current-blocking layer on both sides of the third cladding layer on regions of the surface of the etch-stop layer aside from the specified region, the current-blocking layer having a different type of conductivity to the third cladding layer, wherein the second process forms a surface part of the etch-stop layer using an $(Al_xGa_{1-x})_yIn_{1-y}P$ semiconductor, where $0.2 \leq x < 0.7$ and $0 < y \leq 1$.

In the stated manufacturing method, the etch-stop layer has a surface part formed of an $(Al_xGa_{1-x})_yIn_{1-y}P$ semiconductor (where $0.2 \leq x < 0.7$ and $0 < y \leq 1$) that suffers from relatively little sublimation and is relatively unreactive with various gases. This means that the part of the etch-stop layer exposed to the high temperatures used during the formation of the third cladding layer, during the thermal cleaning, and during the formation of the current blocking layer is difficult to sublimate. This surface also has low reactivity with the gases used during these processes. As a result, an extremely flat etch stop layer can be achieved, with no metamorphosed layer being formed on its surface. This makes it possible to form the layers composing the light-confining structure on top of the etch stop layer with no decrease in the degree of crystallization, and to produce a semiconductor laser with superior laser characteristics (threshold current, slope efficiency).

The second object of the present object can also be achieved by a semiconductor laser manufacturing method, including: a first process forming,(i) a first cladding layer, (ii) an active layer on the first cladding layer, and (iii) a second cladding layer on the active layer, the second cladding layer having a different type of conductivity to the first cladding layer; a second process for forming an etch-stop layer on the second cladding layer, the etch-stop layer having a same type of conductivity as the second cladding layer; a third process for forming a current blocking layer on at least one specified region of a surface of the etch-stop layer using liquid-phase etching, the current blocking layer having a different type of conductivity to the etch-stop layer; a fourth process for performing thermal cleaning in a specified gas atmosphere after the third process has finished; a fifth process for forming a third cladding layer on regions of the surface of the etch-stop layer aside from the specified region so as to contact the current blocking layer, the third cladding layer having a different type of conductivity to the current-blocking layer, wherein the second process forms a surface part of the etch-stop layer using an $(Al_xGa_{1-x})_yIn_{1-y}P$ semiconductor, where $0.2 \leq x < 0.7$ and $0 < y \leq 1$.

In the stated manufacturing method, the etch-stop layer has a surface part formed of an $(Al_xGa_{1-x})_yIn_{1-y}P$ semiconductor (where $0.2 \leq x < 0.7$ and $0 < y \leq 1$) that suffers from relatively little sublimation and is relatively unreactive with various gases. This means that the part of the etch-stop layer exposed to the high temperatures used during the formation of the current blocking layer, during the thermal cleaning, and during the formation of the third cladding layer is difficult to sublimate. This surface also has low reactivity with the gases used during these processes. As a result, an extremely flat etch stop layer can be achieved, with no metamorphosed layer being formed on its surface. This makes it possible to form the layers composing the light-confining structure on top of the etch stop layer with no decrease in the degree of crystallization, and to produce a semiconductor laser with superior laser characteristics (threshold current, slope efficiency).

Here, the third process may perform the liquid-phase etching using an etching solution including tartaric acid.

The stated manufacturing method uses an etching solution containing tartaric acid. This kind of solution has superior etching selectivity for the third cladding layer and current blocking layer. As a result, it is possible to have the etching suitably stop right at the surface of the etch-stop layer. This in turn makes it possible to form the third cladding layer and current blocking layer with the proper shape and thickness. As a result, the semiconductor laser can be made to emit light more precisely in the single lateral mode, thereby improving the laser characteristics. dr

BRIEF DESCRIPTION OF THE DRAWINGS

These and other objects, advantages and features of the invention will become apparent from the following description taken in conjunction with the accompanying drawings which illustrate a specific embodiment of the invention. In the drawings:

FIGS. 2A to 2E show the processes by which the semiconductor laser LS is manufactured;

DESCRIPTION OF THE PREFERRED EMBODIMENTS

An embodiment of the present invention is described in detail below, with reference made to relevant accompanying drawings.

Figure 1:
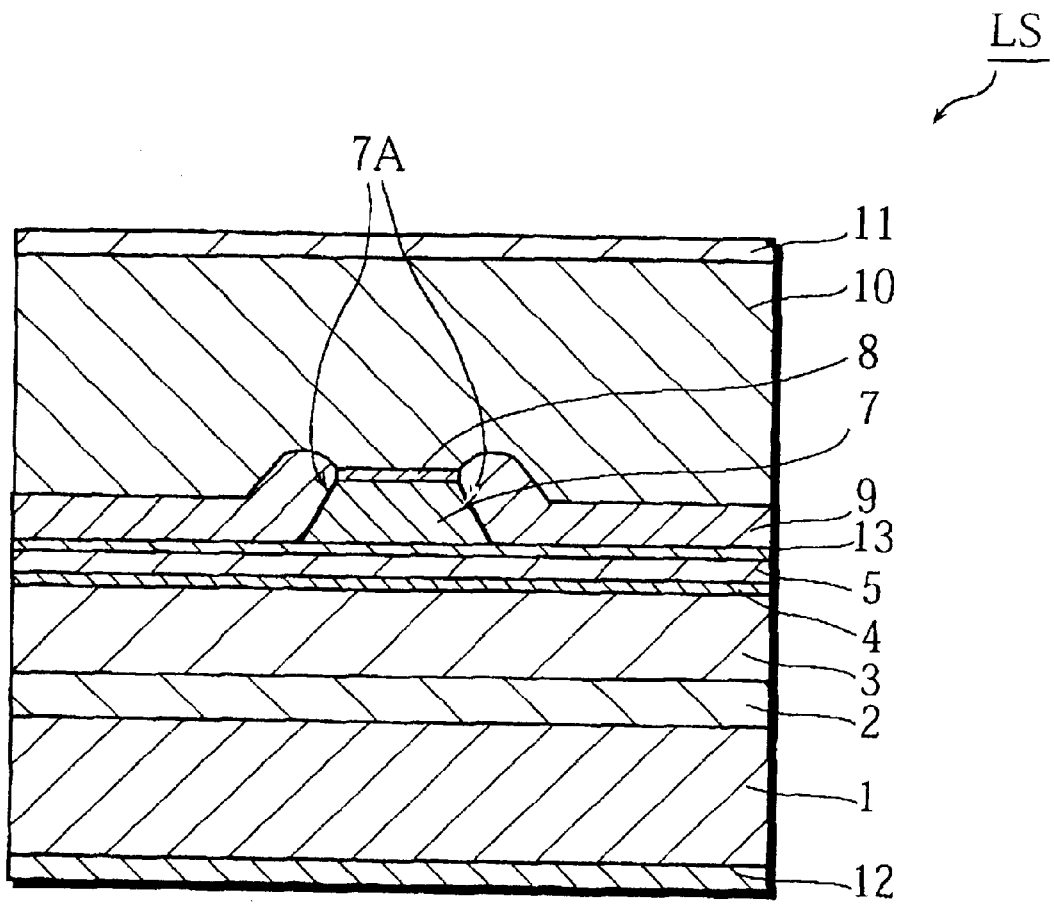
FIG. 1 shows a cross-section of a semiconductor laser LS1 that is a first embodiment of the present invention.
Figure 7:
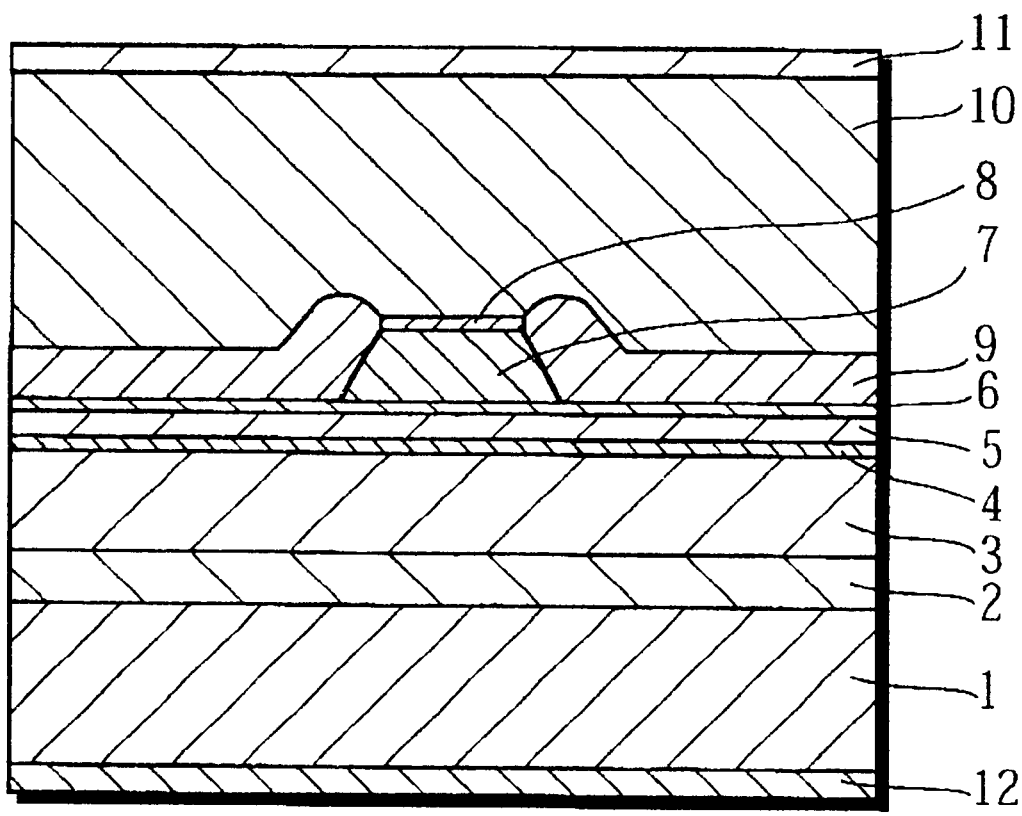
FIG. 7 is a cross-sectional drawing showing the construction of a conventional semiconductor laser.

FIG. 1 shows a cross-section of a semiconductor laser LS that is a first embodiment of the present invention. Components that are the same as those shown in FIG. 7 have been given the same numerals.

As shown in FIG. 1, the semiconductor laser LS has an n-type GaAs substrate 1, on which an n-type GaAs buffer layer 2, an n-type cladding layer 3 made of $Al_{0.35}Ga_{0.15}In_{0.5}P$, an active layer 4, a first p-type cladding layer 5 made of $Al_{0.35}Ga_{0.15}In_{0.5}P$, and an etch-stop layer 13 made of $(Al_xGa_{1-x})_yIn_{1-y}P$ (where $0.2 \leq x < 0.7$, $0 < y \leq 1$) are successively formed in the stated order. A second p-type cladding layer 7 is then formed from $Al_{0.35}Ga_{0.15}In_{0.5}P$ as a ridge on the upper surface of the etch-stop layer 13. An ohmic contact layer 8 made of p-type $Ga_{0.5}In_{0.5}P$ is then formed on top of this second p-type cladding layer 7. A current-blocking layer 9 made of n-type $Al_{0.35}Ga_{0.15}In_{0.5}P$ is formed on both sides of the second p-type cladding layer 7 and the ohmic contact layer 8, and a cap layer 10 with a heat-dissipating action is formed of p-type GaAs on top of the ohmic contact layer 8 and the current-blocking layer 9. A p-type electrode 11 is formed on the cap layer 10, and an n-type electrode 12 is formed on the back of the n-type GaAs substrate 1.

The n-type GaAs substrate 1 has a (100) oriented crystal surface having a 10° misorientation toward a (011) direction.

The buffer layer 2 is provided since forming the n-type cladding layer 3 directly on top of the n-type GaAs substrate 1 would result in the n-type cladding layer 3 reflecting the crystal defects in the n-type GaAs substrate 1. These defects are absorbed by the buffer layer 2.

The active layer 4 is a thin layer with a multilayered multiquantum well construction where well layers formed of a specified thickness (such as 50 Å) or $Ga_{0.5}In_{0.5}P$ alternate a predetermined number of times (such as five) with well layers formed of a specified thickness (such as 100 Å) of $Al_{0.35}Ga_{0.15}In_{0.5}P$.

The first p-type cladding layer 5 is a thin layer with a flat surface.

The etch-stop layer 13 is formed on the first p-type cladding layer 5 and is a p-type thin layer that is highly thermostable. As mentioned above, the etch-stop layer 13 is made of $(Al_xGa_{1-x})_yIn_{1-y}P$ (where $0.2 \leq x < 0.7$, $0 < y \leq 1$). The composition of this etch-stop layer 13 forms the crux of the present invention and is described in detail later in this specification.

The second p-type cladding layer 7 is a thin layer formed in the shape of a ridge, and is positioned in the center of the upper surface of the etch-stop layer 13.

The current-blocking layer 9 is a thin layer formed on the upper surface of the etch-stop layer 13 on both sides of the second p-type cladding layer 7 so as to cover the side faces 7A of the ridge-shaped second p-type cladding layer 7. As the current-blocking layer 9 is formed so as to contact the second p-type cladding layer 7 in all but the central part of the etch-stop layer 13, the etch-stop layer 13 cuts off the downward flow of current from outer regions of the cap layer 10, thereby restricting the flow of current to the second p-type cladding layer 7.

The type electrode 11 composed of the following three metal layers in order of proximity to the cap layer 10; a titanium layer of a specified thickness, such as 50 nm; a platinium layer of a specified thickness, such as 500 nm; and a gold layer of a specified thickness, such as 100 nm. The n-type electrode 12 is composed of the following metal layers in order of proximity to the n-type GaAs substrate 1: a nickel layer of a specified thickness, such as 50 nm; and a gold layer of a specified thickness, such as 500 nm.

In a semiconductor laser with the above construction, holes are supplied from the p-type electrode 11 and electrons are supplied from the n-type electrode 12. PN junctions occur in the active layer 4, so light-producing oscillation occurs.

The light produced in the active layer 4 is confined by the structure composed of the n-type cladding layer 3 to the second p-type cladding layer 7, and is amplified to laser light by stimulated emission. This laser light is guided along the active layer 4 to the outside. The confinement of light by forming the layers above and below the active layer 4 from materials with a low refractive index for light is a conventional technique and so will not be described here.

The current-blocking layer 9 is formed of a material whose refractive index for laser light is lower than that of the second p-type cladding layer 7, so that most of the laser light emitted by the active layer 4 propagates to the second p-type cladding layer 7 and so is confined within the layers between the n-type cladding layer 3 and the second p-type cladding layer 7. This confining action improves the threshold current characteristics of the semiconductor laser, and makes laser emission possible with a lower operating current.

The provision of the current-blocking layer 9 on both sides of the second p-type cladding layer 7 has a further effect in that the current path between the cap layer 10 and the etch-stop layer 13 is narrowed, thereby concentrating the flow of current into the central part of the semiconductor laser LS. As the PN junctions are concentrated in the central part of the active layer 4, laser light can be emitted using a lower operating current.

However, since the narrowing of the current path results in light being mainly emitted in the central part of the active layer 4, the laser needs to be constructed so that the emitted laser light spreads out horizontally to a certain degree to unify the lateral mode of the laser light. In addition to acting so as to confine laser light emitted by the active layer 4 in the vertical direction, the first p-type cladding layer 5 that is formed so as to cover the entire upper surface of the active layer 4 functions so as to unify the lateral mode of the laser light by enabling the light to propagate in the horizontal direction.

The following is a detailed description of the method used to manufacture the semiconductor laser LS. FIGS. 2A to 2E give a simplified representation of the manufacturing method used for the semiconductor laser LS.

Figure 2A:
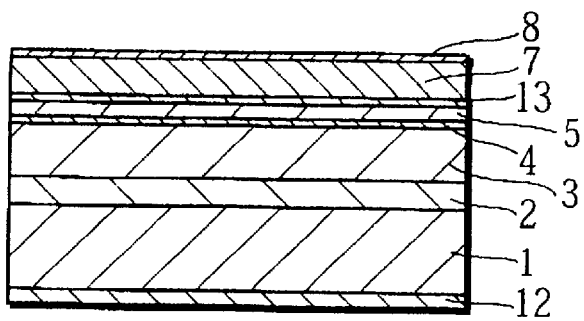

In the procedure shown in FIGS. 2A to 2E, the layers from the n-type buffer layer 2 to the second p-type cladding layer 7 (at this point, the material layer used to form the second p-type cladding layer 7) and the ohmic contact layer 8 (at this point, the material layer used to form the ohmic contact layer 8) are successively formed on top of the n-type GaAs substrate 1 according to MOVPE. FIG. 2A shows the material layers forming the second p-type cladding layer 7 and the ohmic contact layer 8 before they are etched to form a ridge on the etch-stop layer 13. The crystal growth temperature for this structure is around 760° C. Note that the formation of the etch-stop layer 13 is performed according to MOVPE using an $(Al_xGa_{1-x})_yIn_{1-y}P$ composite (where $0.2 \leq x < 0.7$, $0 < y \leq 1$) that has already been doped so as to form a layer with a specified concentration of carriers.

Figure 2B:
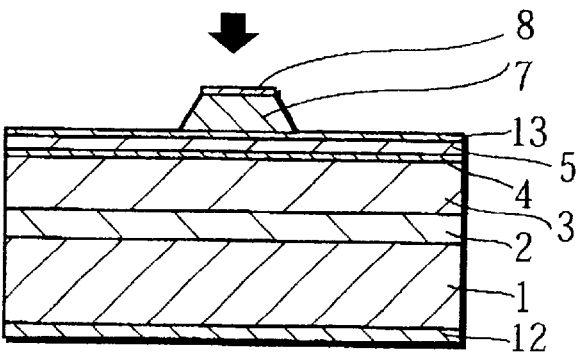

An etching mask (not illustrated) is placed onto the unshaped ohmic contact layer 8 and a specified etching solution is used to etch the unmasked parts of the ohmic contact layer 8 and the second p-type cladding layer 7 as far as the etch-stop layer 13 to form a ridge on the etch-stop layer 13 (as shown in FIG. 2B). In this. way, the second p-type cladding layer 7 and ohmic contact layer 8 are formed in their final shapes.

The multilayer structure shown in FIG. 2B is next subjected to thermal cleaning (FIG. 2C) that removes impurities, such as leftover etching solution, from the surface of the multilayer structure.

Figure 2D:
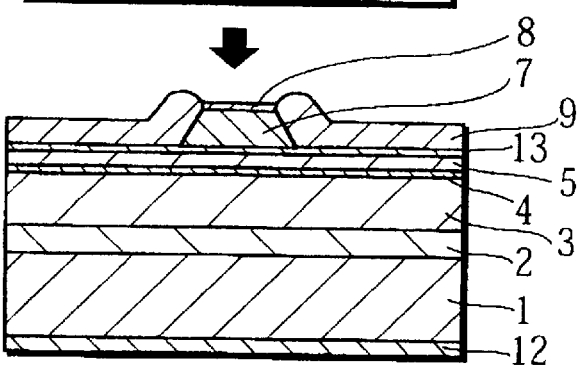
Figure 2E:
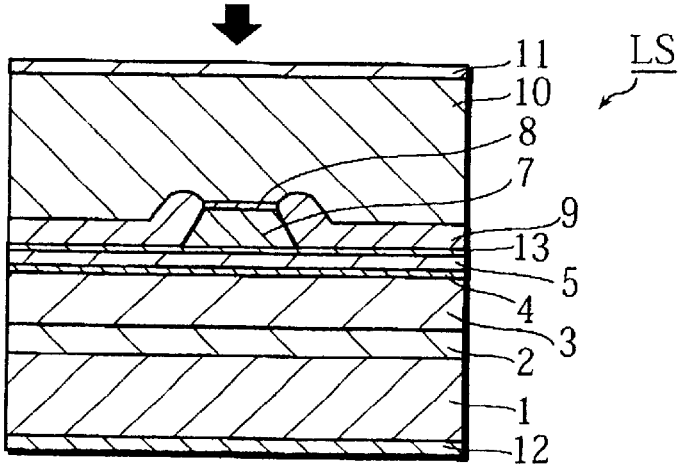

The current-blocking layer 9 is then formed using crystal growth according to MOVPE, as shown in FIG. 2D. This is performed at a crystal growth temperature of around 760° C. MOVPE is also used to form the cap layer 10, again at a crystal growth temperature of around 760° C. Finally, the p-type electrode 11 and n-type electrode 12 are formed, as shown in FIG. 2E.

The above manufacturing method produces an etch-stop layer 13 of an $(Al_xGa_{1-x})_yIn_{1-y}P$ composite (where $0.2 \leq x < 0.7$, $0 < y \leq 1$) that is difficult to sublimate. During the process that forms the second p-type cladding layer 7, the thermal cleaning, and the formation of the current-blocking layer 9 that follow the formation of the etch-stop layer 13, sublimation from the surface of the etch-stop layer 13 is therefore suppressed, enabling this surface to be kept flat.

The above effect was confirmed by the following experiment.

Figure 3:
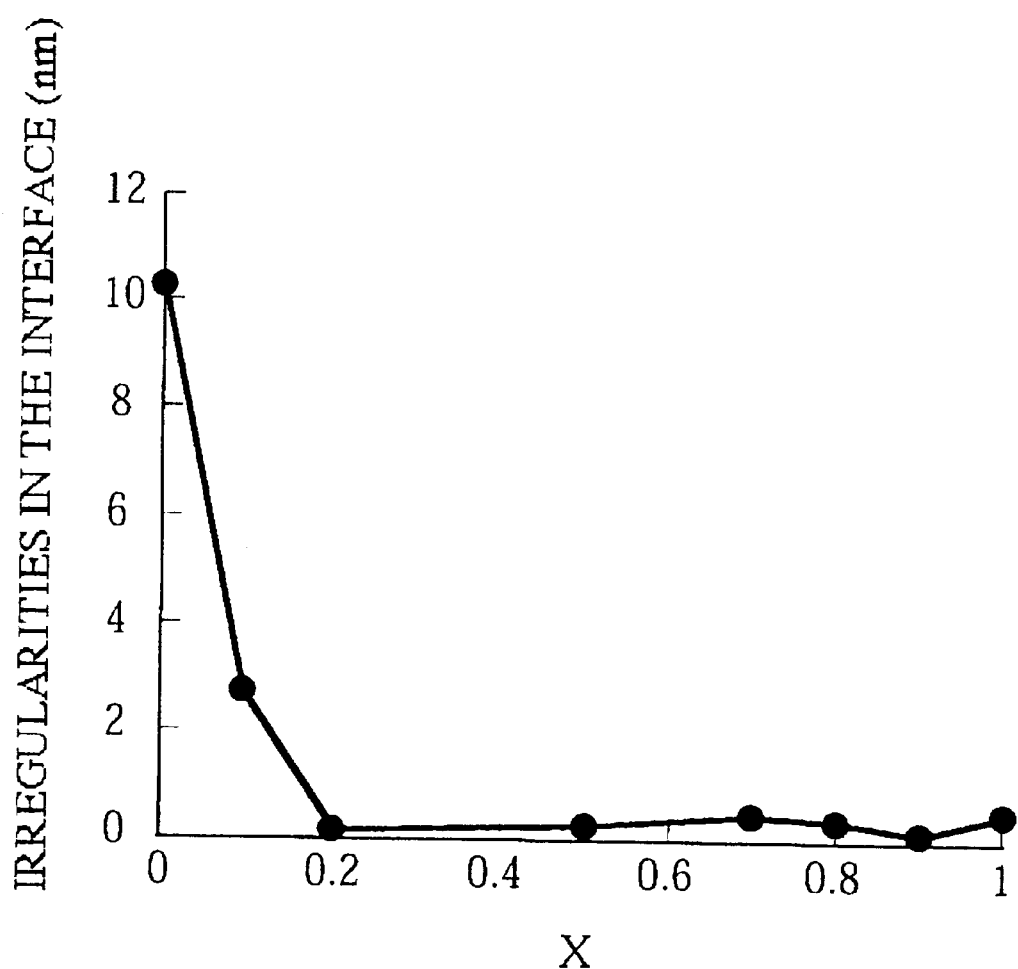
FIG. 3 is a graph showing the relationship between the composition of the etch-stop layer and the extent to which irregularities are produced in the surface of the etch-stop layer by the thermal cleaning.

FIG. 3 shows the relationship between the value of x in the composite of the etch-stop layer 13 formed in the above manufacturing method and the extent to which bumps and concaves (hereafter collectively referred to as "irregularities") are present in the surface of the etch-stop layer 13 after the thermal cleaning. The horizontal axis represents the value of x in the $(Al_xGa_{1-x})_yIn_{1-y}P$ composite while the vertical axis represents the degree of irregularities. The experiment was conducted with the value of y at 0.5 and the thermal cleaning being performed at 760° C. The irregularities were measured according to a step measurement method and mean values were calculated to produce the values used in FIG. 3.

As shown in FIG. 3, the larger the value of x, which is to say the higher the proportion of aluminum relative to the proportion of gallium, the smaller the sizes of the irregularities in the surface of the etch-stop layer 13. For values of x that are 0.2 or higher, the value indicating the size of the irregularities is almost zero.

The results shown in FIG. 3 indicate that the condition $0.2 \leq x$ for the $(Al_xGa_{1-x})_yIn_{1-y}P$ composite ensures that deterioration in the flatness of the etch-stop layer 13 during the heat process will be sufficiently suppressed.

It is believed that there are fewer irregularities in the surface of a layer formed of this composite when the proportion of aluminum is high relative to the proportion of gallium due to the relatively high atomization temperature of aluminum. Therefore, as the proportion of aluminum relative to gallium increases, sublimation becomes increasingly difficult for the composite material.

On the other hand, the condition $x < 0.7$ is set since the etch-stop layer 13 does not act as a barrier to the etching when x is 0.7 or above. Another reason is that as the total amount of aluminum increases, evidence shows that there is a general decrease in the functioning of a semiconductor.

Note that the characteristics shown in FIG. 3 were confirmed for a range of values of y (i.e., $0 < y \leq 1$).

In the above manufacturing method, the etch-stop layer 13 is formed of an $(Al_xGa_{1-x})_yIn_{1-y}P$ composite (where $0.2 \leq x < 0.7$, $0 < y \leq 1$) whose reactivity with various gases is low. This prevents the surface of the etch-stop layer 13 from reacting with the gases, such as phosphine, used in the processes following the formation of the etch-stop layer 13, such as the process forming the second p-type cladding layer 7, the thermal cleaning, or the formation of the current-blocking layer 9. As a result, the formation of a metamorphosed layer on the surface of the etch-stop layer 13 can be prevented.

This effect was confirmed by the experiment described below.

Figure 4:
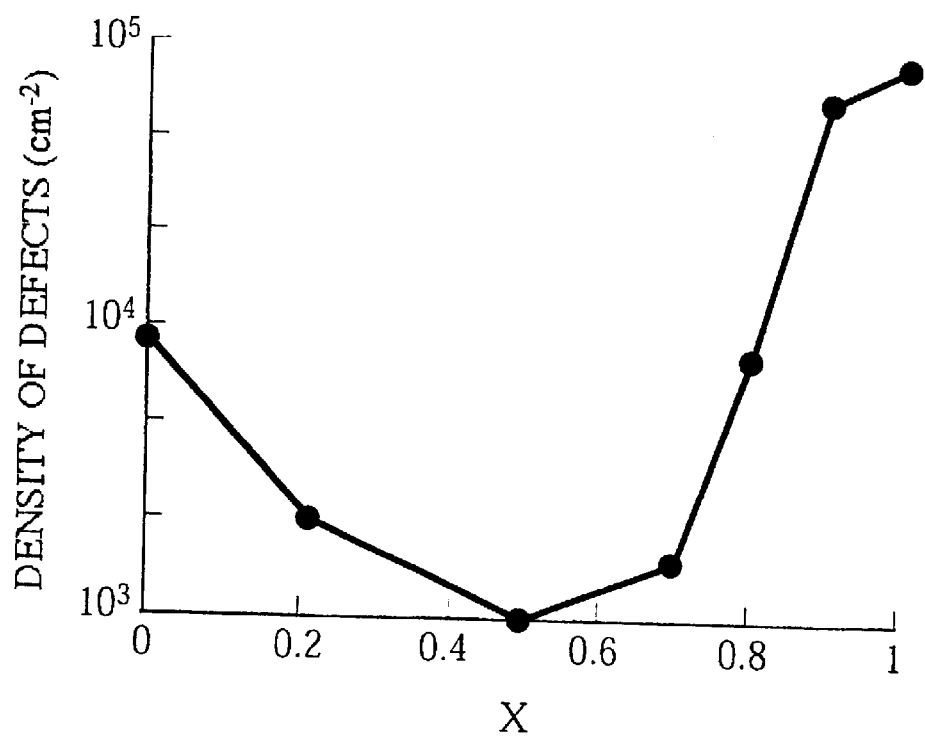
FIG. 4 is a graph showing the relationship between composition of the etch-stop layer and the density (incidence) of crystal defects in the surface of the second p-type cladding layer due to the thermal cleaning.

FIG. 4 shows the relationship between the value of x in the composite of the etch-stop layer 13 formed in the above manufacturing method and the density of the crystal defects in the surface of the second p-type cladding layer 7 due to the heat processing. These measurements were taken during a midpoint in the manufacturing method where all layers up to the second p-type cladding layer 7 have been formed. In FIG. 4, the horizontal axis represents the value of x in the $(Al_xGa_{1-x})_yIn_{1-y}P$ composite, while the vertical axis shows values that indicate the density of the crystal defects. This experiment was conducted with the value y=0.5 for the $(Al_xGa_{1-x})_yIn_{1-y}P$ composite, and thermal cleaning was performed at 760° C. in the presence of phosphine. The density of crystal defects was found by observing the crystals under a transmission electron microscope and counting the number of crystal defects per unit area. When observing the crystals under a transmission electron microscope, crystal defects show up as black lines in the image.

As can be seen from FIG. 4, there is a decrease in the density of crystal defects as the value of x increases within the range between zero and 0.5. The smallest number of defects was observed for the value x=0.5, and the rate with which the density of crystal defects decreases is notably smaller for the range where $0.2 \leq x < 0.5$ than for the range where $0 \leq x < 0.2$. Once the value of x exceeds 0.5, there is an increase in the density of crystal defects, with the rate with which the density of crystal defects increases being notably larger for the range where $x \geq 0.7$ than for the range where $0.5 < x < 0.7$.

As described above, the density of crystal defects changes depending on the value of x, which is to say, the proportion of aluminum relative to gallium. It is believed that when this value is high, a larger amount of impurities are absorbed by the surface, forming a region (metamorphosed layer) that is one kind of defect. As stated earlier, it is also believed that higher proportions of aluminum relative to gallium result in higher reactivity between the surface of the etch-stop layer 13 and the phosphine gas atmosphere that is used during thermal cleaning. This is to say, as the proportion of aluminum relative to gallium increases, there is an increase in reactivity with gases at high-temperatures.

When viewed in terms of the reduction in crystal defects and the stability of the crystallization, the above experimental results show that setting the value x in a range $0.2 \leq x < 0.7$ for the $(Al_xGa_{1-x})_yIn_{1-y}P$ composite is effective in reducing the reactivity of the surface of the etch-stop layer 13 with gas at high temperatures.

Note that the characteristics shown in FIG. 4 were confirmed for a range of values of y (i.e., $0 < y \leq 1$).

When the etch-stop layer 13 is formed of an $(Al_xGa_{1-x})_yIn_{1-y}P$ composite (where $0.2 \leq x < 0.7$, $0 < y \leq 1$) and the second p-type cladding layer 7 is formed by liquid-phase etching, sulfuric acid is used as the etching solution. In this case, however, it is very difficult to have the selective etching of the material layer that forms the second p-type cladding layer 7 stop right at the surface of the etch-stop layer 13. The ability to selectively etch the material layer forming the second p-type cladding layer 7 depends on the ratio of aluminum to gallium in the etch-stop layer 13, and there is a tendency for this ability to decrease as the ratio of aluminum to gallium increases.

When the etch-stop layer 13 is formed of an $(Al_xGa_{1-x})_yIn_{1-y}P$ composite (where $0.2 \leq x < 0.7$, $0 < y \leq 1$), the etching solution used to selectively etch the material layer forming the second p-type cladding layer 7 should preferably have favorable etching characteristics. As a specific example, tartaric acid may be used as the etching solution, either by itself or in a mixture with hydrochloric and/or other acids. As a further example, the etching solution can be composed of a 1:1 (by volume) mixture of tartaric and hydrochloric acids.

When an etching solution with favorable selective etching characteristics is used to etch the material layer forming the second p-type cladding layer 7, etching can be stopped right at the etch-stop layer 13. This makes it possible to accurately set the thicknesses of the current-blocking layer 9 and the second p-type cladding layer 7.

Figure 5:
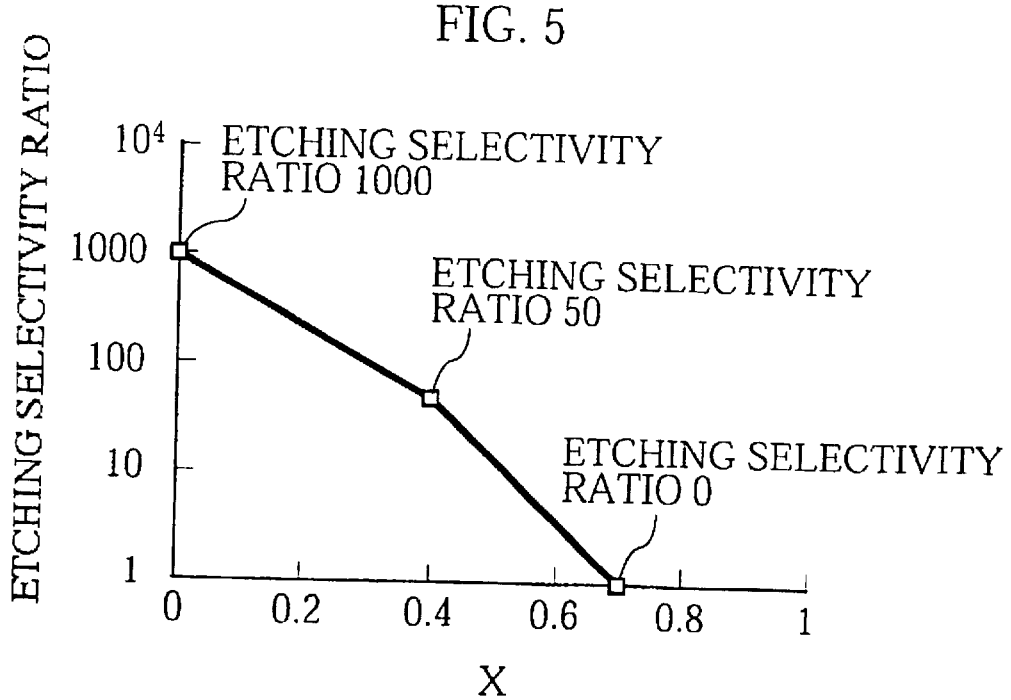
FIG. 5 is a graph showing the relationship between the composition of the etch-stop layer and the selectivity of the etching performed on the second p-type cladding layer.

FIG. 5 shows the relationship between the composition of the etch-stop layer 13 and the etching selectivity for the second p-type cladding layer 7. The horizontal axis shows the value of x in the $(Al_xGa_{1-x})_yIn_{1-y}P$ composite, while the vertical axis shows etching selectivity. Note that the value y=0.5 was used for the $(Al_xGa_{1-x})_yIn_{1-y}P$ composite.

The etching selectivity was calculated as follows. A layer formed of $Al_{0.35}Ga_{0.15}In_{0.5}P$ was etched using tartaric acid and the extent (depth) to which the etching progresses was divided by the etching time to give the value E1. This value is then divided by the value E2 (produced by dividing the extent (depth) to which the etching progresses when a layer formed of $(Al_xGa_{1-x})_{0.5}In_{0.5}P$ (where x=0, 0.4 or 0.7) was etched using tartaric acid and is divided by the etching time) to give the etching ratio (E1/E2).

The selectivity of the etching can be said to increase as the etching ratio (E1/E2) increases.

FIG. 5 shows that the selectivity of the etching decreases as the value x, which is to say the ratio of aluminum to gallium increases. However, the rate at which the selectivity decreases is more pronounced when sulfuric acid is used, so that by using tartaric acid as the etching solution, decreases in the etching selectivity that accompany increases in the value of x can be limited.

To summarize the above, the etch-stop layer is composed of an $(Al_xGa_{1-x})_yIn_{1-y}P$ composite (where $0.2 \leq x < 0.7$, $0 < y \leq 1$) which suffers from relatively little sublimation and has relatively low reactivity with various gases. This means that during manufacturing, the surface of the etch-stop layer can be kept flat and changes in the composition of the surface can be avoided. As a result the second p-type cladding layer 7 and the current-blocking layer 9 can be produced with a high degree of crystallization.

Since an etching solution with a superior etching selectivity is used when etching the second p-type cladding layer and the etch-stop layer, the second p-type cladding layer 7 and the current-blocking layer 9 can be formed at the proper thickness. As a result, the single lateral mode of the laser can be realized more precisely.

The characteristics of the present semiconductor laser LS were evaluated as follows. This evaluation was performed for a laser having layers whose thicknesses and doping levels are given in Table 1 below. Note that carrier concentrations are values for the finished laser.

TABLE 1

| Name | Carrier Concentration ($cm^{-3}$) | Thickness |
| --- | --- | --- |
| cap layer 10 | $5 * 10^{18}$ | 4 μm |
| current-blocking layer 9 | $2 * 10^{12}$ | 0.8 μm |
| ohmic contact | $1 * 10^{18}$ | 500 Å |

TABLE 1-continued

| Name | Carrier Concentration (cm$^{-3}$) | Thickness |
|---|---|---|
| layer 8 | | |
| second p-type cladding layer 7 | 1 * 10$^{18}$ | 1.3 µm |
| etch-stop layer 13 | 3 * 10$^{17}$ | 100 Å |
| first p-type cladding layer 5 | 3 * 10$^{17}$ | 0.25 µm |
| active layer 4 | 1 * 10$^{15}$ or below | 450 Å |
| n-type cladding layer 3 | 1 * 10$^{18}$ | 1.5 µm |
| n-type buffer layer 2 | 1 * 10$^{18}$ | 0.3 µm |

Figure 6:
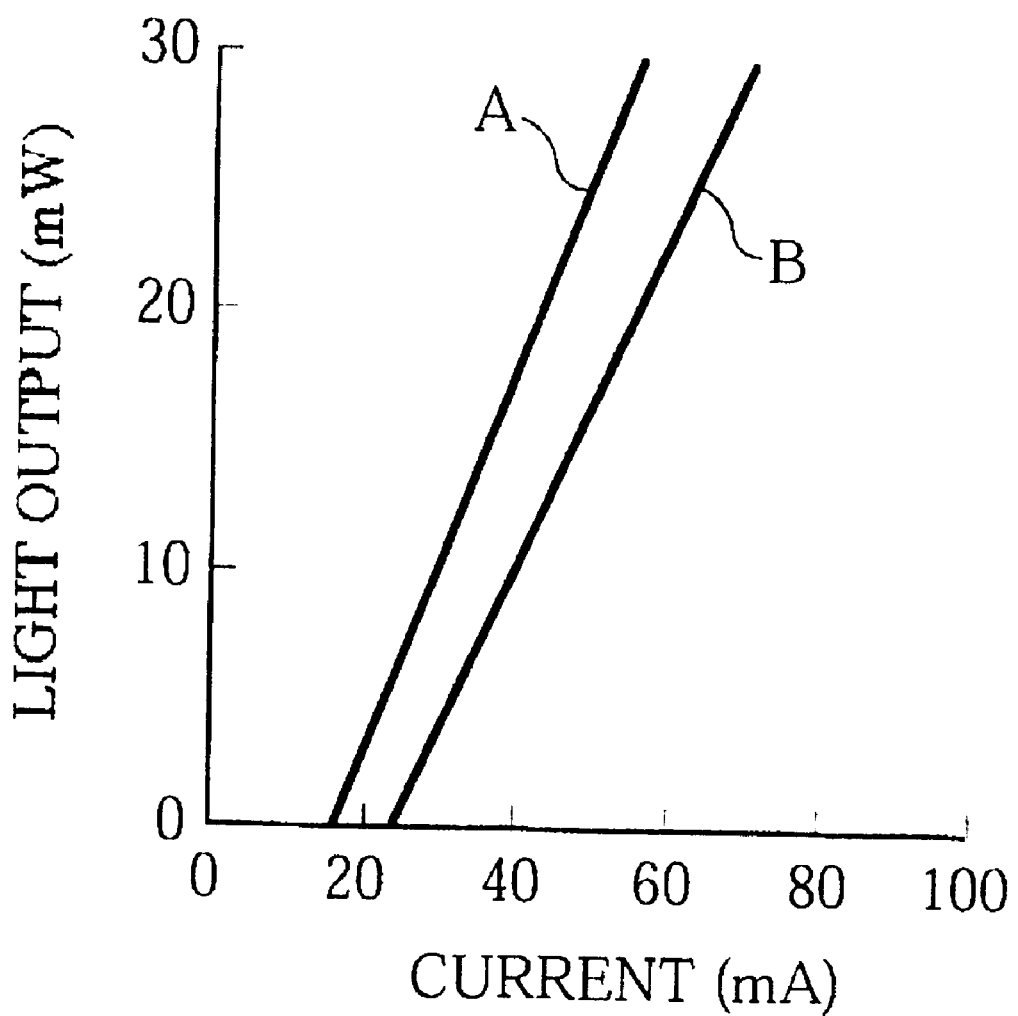
FIG. 6 shows the current-light output characteristics of semiconductor lasers.

FIG. 6 shows the current-output light characteristics for the present semiconductor laser as the curve A and the same characteristics for a conventional 650 nm semiconductor laser as the curve B. As shown in FIG. 6, the semiconductor laser of the present invention has a lower oscillation threshold current and higher slope efficiency than the conventional semiconductor laser.

While the above explanation states that the current-blocking layer 9 is formed after the second p-type cladding layer 7, it is equally possible for the current-blocking layer 9 to be formed in a specified shape before the second p-type cladding layer 7 is formed.

In the present semiconductor laser LS, the band gap of the etch-stop layer 13 can be set narrower than the band gap of the active layer, which has the effects described above and enables the etch-stop layer 13 to absorb the light generated in the active layer 4. Since there is no need to provide layers to absorb the light generated in the active layer 4, this means that a self-excited oscillating laser (a pulse laser) can be achieved without an enlarged structure. Note that the principles behind laser oscillation in pulse form based on the setting of the band gap are described in detail in "Applied Physics Letter 68" (1996) 3543.

The above explanation states that the n-type buffer layer 2 . . . are successively formed on the n-type GaAs substrate, although the opposite conductivity may be used, so that a p-type buffer layer, a p-type cladding layer. may be successively formed on a p-type GaAs substrate, in this case, the conductivity of the current-blocking layer is p-type.

Although the present invention has been fully described by way of examples with reference to accompanying drawings, it is to be noted that various changes and modifications will be apparent to those skilled in the art. Therefore, unless such changes and modifications depart from the scope of the present invention, they should be construed as being included therein.

What is claimed is:

1. A semiconductor laser, comprising:
a first cladding layer;
an active layer that is formed on top of the first cladding layer;
a second cladding layer that is formed on top of the active layer and has a different type of conductivity to the first cladding layer;
an etch-stop layer that is formed on top of the second cladding layer and has a same type of conductivity as the second cladding layer; and
a light-confining construction that is formed on top of the etch-stop layer by an etching process,
wherein the etch-stop layer has surface part that contacts the light-confining construction, the surface part being composed of an $(Al_xGa_{1-x})_yIn_{1-y}P$ semiconductor, where $0.2 \leq x < 0.5$ and $0 < y \leq 1$.

2. A semiconductor laser according to claim 1,
wherein the light-confining construction includes:
a third cladding layer that is formed as a ridge on a specified region of a surface of the etch-stop layer and has a same type of conductivity as the etch-stop layer; and
a current-blocking layer that has a different type of conductivity to the third cladding layer and is formed on both sides of the third cladding layer on regions of the surface of the etch-stop layer aside from the specified region.

3. A semiconductor laser according to claim 2,
wherein the etch-stop layer has a band gap that is narrower than a band gap of the active layer.

4. A semiconductor laser according to claim 1,
wherein the etch-stop layer has a band gap that is narrower than a band gap of the active layer.

5. A semiconductor laser according to claim 1, wherein y=0.5.

6. A semiconductor laser manufacturing method, comprising:
a first process forming
(i) a first cladding layer,
(ii) an active layer on top of the first cladding layer, and
(iii) a second cladding layer on top of the active layer, the second cladding layer having a different type of conductivity to the first cladding layer;
a second process for forming an etch-stop layer on top of the second cladding layer, the etch-stop layer having a same type of conductivity as the second cladding layer;
a third process for forming a ridge-shaped third cladding layer on a specified region of a surface of the etch-stop layer using liquid-phase etching, the third cladding layer having a same type of conductivity as the etch-stop layer;
a fourth process for performing thermal cleaning in a specified gas atmosphere after the third process has finished;
a fifth process for forming a current-blocking layer on both sides of the third cladding layer on regions of the surface of the etch-stop layer aside from the specified region, the current-blocking layer having a different type of conductivity to the third cladding layer,
wherein the second process forms a surface part of the etch-stop layer using an $(Al_xGa_{1-x})_yIn_{1-y}P$ semiconductor, where $0.2 \leq x < 0.5$ and $0 < y \leq 1$.

7. A semiconductor laser manufacturing method according to claim 6,
wherein the third process performs the liquid-phase etching using an etching solution including tartaric acid.

8. A semiconductor laser manufacturing method according in claim 6,
wherein the second process of forming an etch-stop layer on top of the second cladding layer included forming an etch-stop layer having a band gap that is narrower than a band gap of the active layer formed in the first process.

9. A semiconductor laser manufacturing method, comprising:

a first process forming
(i) a first cladding layer,
(ii) an active layer on the first cladding layer, and
(iii) a second cladding layer on the active layer,
the second cladding layer having a different type of conductivity to the first cladding layer;

a second process for forming an etch-stop layer on the second cladding layer, the etch-stop layer having a same type of conductivity as the second cladding layer;

a third process for forming a current blocking layer on at least one specified region of a surface of the etch-stop layer using liquid-phase etching, the current blocking layer having a different type of conductivity to the etch-stop layer;

a fourth process for performing thermal cleaning in a specified gas atmosphere after the third process has finished;

a fifth process for forming a third cladding layer on regions of the surface of the etch-stop layer aside from the specified region so as to contact the current blocking layer, the third cladding layer having a different type of conductivity to the current-blocking layer, wherein the second process forms a surface part of the etch-stop layer using an $(Al_xGa_{1-x})_yIn_{1-y}P$ semiconductor, where $0.2 \leq x < 0.5$ and $0 < y \leq 1$.

10. A semiconductor laser manufacturing method according to claim 9, wherein the third process performs the liquid-phase etching using an etching solution including tartaric acid.

11. A semiconductor laser manufacturing method according to claim 9, wherein the second process of forming an etch-stop layer on top of the second cladding layer includes forming an etch-stop layer having a band gap that is narrower than a band gap of the active layer formed in the first process.

* * * * *